(12) United States Patent
Loeliger et al.

(10) Patent No.: US 7,031,408 B2
(45) Date of Patent: Apr. 18, 2006

(54) MECHANISM FOR REDUCING RECOVERY TIME AFTER PATH LOSS IN CODED DATA COMMUNICATION SYSTEM HAVING SEQUENTIAL DECODER

(75) Inventors: Hans-Andrea Loeliger, Zuerich (CH); Felix Tarköy, Binningen (CH); Richard Goodson, Huntsville, AL (US)

(73) Assignee: Adtran Inc., Huntsville, AL (US)

( * ) Notice: Subject to any disclaimer, the term of this patent is extended or adjusted under 35 U.S.C. 154(b) by 785 days.

(21) Appl. No.: 10/136,189

(22) Filed: Apr. 30, 2002

(65) Prior Publication Data

US 2003/0026359 A1 Feb. 6, 2003

Related U.S. Application Data

(63) Continuation-in-part of application No. 09/208,692, filed on Dec. 10, 1998, now abandoned.

(60) Provisional application No. 60/067,777, filed on Dec. 10, 1997.

(51) Int. Cl.
*H04L 27/06* (2006.01)

(52) U.S. Cl. .................. 375/341; 714/791; 714/795

(58) Field of Classification Search ........ 375/264–265, 375/341; 714/786, 789, 791–792, 793–795, 714/755
See application file for complete search history.

(56) References Cited

U.S. PATENT DOCUMENTS

| | | | | |
|---|---|---|---|---|
| 4,677,622 A | * | 6/1987 | Okamoto et al. | 714/756 |
| 4,998,253 A | * | 3/1991 | Ohashi et al. | 714/791 |
| 5,408,499 A | * | 4/1995 | Sasaki | 375/286 |
| 5,710,783 A | * | 1/1998 | Luthi et al. | 714/755 |
| 5,737,365 A | | 4/1998 | Gilbert et al. | 375/224 |
| 6,078,625 A | | 6/2000 | McCallister et al. | 375/261 |

OTHER PUBLICATIONS

"New Turbo-Like Codes" By Hans-Andrea Loeliger, Oct. 16, 1996, Submitted to ISIT '97, pp. 1-5.

(Continued)

*Primary Examiner*—Khanh Tran
(74) *Attorney, Agent, or Firm*—Allen, Dyer, Doppelt, Milbrath & Gilchrist P.A.

(57) ABSTRACT

A search path recovery mechanism for a sequential decoder employs a prescribed self-concatenated "Loeliger" convolutional code, that is either decodable by the sequential decoder for data recovery, or is decodable (although suboptimally) by a Viterbi decoder as an adjunct to the sequential decoder to improve statistics during path recovery. The Viterbi decoder is incorporated in an alternate decoder which includes metric calculators, that compute branch metrics, that are alternately coupled to the Viterbi decoder, operating at twice the symbol rate. Using estimate bits from the Viterbi decoder, a syndrome former estimates the recovered state and generates an estimate of the validity of the recovered state. Their validity is verified by a path recovery detector, which operates as a zero error detection filter by summing a prescribed number of previous syndrome former outputs. When the sum of a consecutive number of syndrome former outputs is zero, the contents of the syndrome former are transferred to corresponding stages of the sequential decoder, to set the recovered path origination state for the sequential decoder. Once the sequential decoder has recovered to its correct origin state, a new origin state will not be required from the syndrome former unless path loss occurs.

22 Claims, 9 Drawing Sheets

OTHER PUBLICATIONS

"Efficient Sequential Decoding of Trellis Codes", a Dissertation by Fu_Quan Wang, Submitted to the Graduate School of the University of Notre Dame, Department of Electrical Engineering, Notre Dame, Indiana, Dec. 1992, includes Pates 1-49, 50-55 and 72-77.

"Channel Coding with Multilevel/Phase Signals" by Gottfried Ungerboeck, 1982, IEEE *Transactions on Information Theory*, vol. IT-28, No. 1, Jan., 1982, pp. 55-67.

"Rapid Path Recovery Codes for Sequential Decoding", By Hans-Andrea Loeliger and Felix Tarkoy, Aug. 28, 1997, Endora Tech Ag, Communication Engineering, pp. 1-11.

"Maximum Likelihood Decoding of Convolutional Codes", By Shu Lin and Daniel J. Costello, Jr., *Error Control Coding Fundamentals and Applications*, Printice-Hall, Inc., 1983, pp. 315-387.

* cited by examiner

| $i$ | 0 | 1 | 2 | 3 | 4 | 5 | 6 | 7 | 8 | 9 |
|---|---|---|---|---|---|---|---|---|---|---|
| $cd_i$ | 4 | 5 | 5 | 6 | 6 | 7 | 7 | 8 | 8 | 9 |
| $m$ | 0 | 1 | 1 | 2 | 2 | 2 | 2 | 2 | 2 | 2 |

| $i$ | 10 | 11 | 12 | 13 | 14 | 15 | 16 | 17 | 18 | 19 |
|---|---|---|---|---|---|---|---|---|---|---|
| $cd_i$ | 9 | 10 | 10 | 10 | 11 | 11 | 11 | 12 | 12 | 12 |
| $m$ | 2 | 3 | 3 | 3 | 11 | 11 | 11 | 11 | 11 | 11 |

| $i$ | 20 | 21 | 22 | 23 | 24 | 25 | 26 | 27 | 28 | 29 |
|---|---|---|---|---|---|---|---|---|---|---|
| $cd_i$ | 12 | 13 | 13 | 13 | 13 | 14 | 14 | 14 | 15 | 15 |
| $m$ | 11 | 11 | 11 | 11 | 11 | 13 | 13 | 13 | 14 | 14 |

| | 20 | 25 | 30 | 35 | 40 |
|---|---|---|---|---|---|
| $L_{av}$ | 151 | 353 | 805 | 1815 | 4069 |
| $L_{0.9}$ | 347 | 812 | 1853 | 4179 | 9367 |

| $i$ | 0 | 1 | 2 | 3 | 4 | 5 | 6 | 7 | 8 | 9 |
|---|---|---|---|---|---|---|---|---|---|---|
| $cd_i$ | 4 | 5 | 5 | 6 | 6 | 7 | 7 | 8 | 8 | 9 |
| $i$ | 10 | 11 | 12 | 13 | 14 | 15 | 16 | 17 | 18 | 19 |
| $cd_i$ | 9 | 10 | 10 | 10 | 11 | 11 | 11 | 12 | 12 | 12 |
| $i$ | 20 | 21 | 22 | 23 | 24 | 25 | 26 | 27 | 28 | 29 |
| $cd_i$ | 12 | 13 | 13 | 13 | 13 | 13 | 14 | 14 | 14 | 15 |
| $i$ | 30 | 31 | 32 | 33 | 34 | 35 | 36 | 37 | 38 | 39 |
| $cd_i$ | 15 | 15 | 15 | 16 | 16 | 16 | 16 | 16 | 17 | 17 |

FIG. 7.

| $i$ | 20 | 21 | 22 | 23 | 24 | 25 | 26 | 27 | 28 | 29 |
|---|---|---|---|---|---|---|---|---|---|---|
| $cd_i$ | 12 | 13 | 13 | 13 | 13 | 13 | 13 | 14 | 14 | 14 |
| $i$ | 30 | 31 | 32 | 33 | 34 | 35 | 36 | 37 | 38 | 39 |
| $cd_i$ | 14 | 15 | 15 | 15 | 16 | 16 | 16 | 16 | 16 | 16 |
| $i$ | 40 | 41 | 42 | 43 | 44 | 45 | 46 | 47 | 48 | 49 |
| $cd_i$ | 17 | 17 | 17 | 17 | 18 | 18 | 18 | 18 | 18 | 18 |

FIG. 8.

MECHANISM FOR REDUCING RECOVERY TIME AFTER PATH LOSS IN CODED DATA COMMUNICATION SYSTEM HAVING SEQUENTIAL DECODER

CROSS-REFERENCE TO RELATED APPLICATIONS

The present application is a continuation-in-part of U.S. patent application Ser. No. 09/208,692, filed Dec. 10, 1998, by Hans-Andrea Loeliger et al, entitled: "MECHANISM FOR REDUCING RECOVERY TIME AFTER PATH LOSS IN CODED DATA COMMUNICATION SYSTEM HAVING SEQUENTIAL DECODER," (now abandoned) which application claims the benefit of U.S. Provisional Application No. 60/067,777 filed Dec. 10, 1997, each application being assigned to the assignee of the present application and the disclosures of which are incorporated herein.

FIELD OF THE INVENTION

The present invention relates in general to communication systems, and is particularly directed to a new and improved search path recovery mechanism for a sequential decoder, that employs a concatenated convolutional code that is readily decodable by the sequential decoder for data recovery, or that may be suboptimally decoded by relatively simple Viterbi decoder, for path recovery. The output of the Viterbi decoder is processed using a syndrome former, which estimates the recovered state. Once the recovered state has been validated, the contents of the syndrome former are coupled to corresponding stages of the sequential decoder, to establish the originating node of its recovered path.

BACKGROUND OF THE INVENTION

FIG. 1 diagrammatically illustrates an encoded digital communication system comprised of a transmitter device 1, such as a first modem, that communicates with a receiving device 2, such a second modem, via a channel 4 therebetween. The input to the transmitter device 1 and the output of the receiving device 2 is digital data in the form of a serial stream of bits denoted as DATA OUT. The input data stream, DATA IN, is encoded such as by means of a trellis coded modulation scheme shown in FIG. 2. The output of the transmitter device 1 and the input of the receiver 2 are respective voltage levels, which ideally are the same. However, the channel can introduce both phase and amplitude distortion and both additive and multiplicative noise, to the transmitted signal.

In the trellis coded modulator of FIG. 2, an input serial bit stream denoted DATA IN is coupled to a serial-to-parallel converter 3, which converts the serial data stream into parallel form. One of the bit outputs 5 of the serial-to-parallel converter 3 is coupled to a rate ½ convolutional encoder 6, which produces two output bits u and y. These two bits plus the other bits (two in the illustrated example) from the serial-to-parallel converter 3 are coupled to a (one-out-of-sixteen) level mapper 7, which maps all of the possible combinations (sixteen in the present example) of the input bits (four in the example) into (sixteen) associated unique voltage levels at its output port denoted LEVEL OUT.

For non-limiting examples of U.S. Patents disclosing encoding and decoding schemes, including trellis-coded modulation (TCM) techniques, attention may be directed to the U.S. Patents to Gilbert et al, U.S. Pat. No. 5,737,365, and McCallister et al, U.S. Pat. No. 6,078,625.

In accordance with the encoding/decoding scheme described in the U.S. patent to Gilbert et al al, U.S. Pat. No. 5,737,365, multiple encoders are installed at a transmit site and multiple decoders are installed at a receiver site. In operation, one of a predetermined set of trellis codes is selected at a time—either by default or through a prior communication between the transmitting transceiver and the receiving transceiver. The receiver then determines the signal quality on the received trellises for that decoder. If the signal quality is too low for the selected set of trellises, the receiver will either request or select (depending upon whether the control lies in the transmitter or receiver) a set of trellises with greater immunity to noise. On the other hand, if the signal quality is relatively high, then trellises with an increased number of constellation points and higher data rates may be used. Namely, in Gilbert et al, code selection is based on the current signal and noise condition, and there is a corresponding encoder/decoder set for each of the predetermined trellis codes.

The U.S. Patent to McCallister et al, U.S. Pat. No. 6,078,625 discloses a decoding scheme that employs a concatenated decoder configured to match inner and outer codes, and resolve phase ambiguities without the need for differentially encoded user data.

Additional publications that describe encoding and decoding mechanisms include an article by G. Ungerboeck, entitled "Channel Coding With Multilevel/Phase Signals," IEEE Transactions on Information Theory, January 1982, pp 55–67; an article by F. Q. Wang, entitled "Efficient Sequential Decoding of Trellis Codes," Ph.D. Thesis, University of Notre Dame, December 1992, wherein the use of sequential decoding to decode TCM signals is described; and the text by S. Lin and D. J. Costello, entitled "Error Control Coding: Fundamentals and Application," Prentice-Hall, 1983, which is a relatively complete description of sequential decoding and Viterbi decoding.

Sequential decoding is a well-known method of decoding digital data sequences which have been encoded using a convolutional encoder as in the communication system of FIG. 1. As such, it is a viable mechanism for single-loop high data rate digital subscriber loop (HDSL) communications. Now although a sequential decoder is a good trade-off between complexity and performance, it suffers from occasional 'path loss' or 'loss of synchronization' due to computational overload. In the present description, the term 'loss of synchronization' is synonymous with the term 'path loss'.

The effect of path loss (or loss of synchronization) is that the sequential decoder must restart and then enter a path recovery mode of operation, during which it searches for the correct starting state or recovers synchronization before sequential decoding can resume. As long as the sequential decoder is in its normal decoding mode, its output is reliable and the probability of error is very low. However, during the period of time that the sequential decoder loses synchronization and is performing path recovery, its output is considerably less reliable and the probability of error is very high.

Therefore, it is desirable to minimize the time spent in performing path recovery, or recovering synchronization and, instead, to maximize the time spent performing sequential decoding. Accordingly, there is a need for a mechanism which will decrease the time spent in path recovery for a sequential decoder.

SUMMARY OF THE INVENTION

In accordance with the present invention, this need is effectively satisfied by a new and improved search path recovery mechanism for a sequential decoder, that employs a prescribed self-concatenated convolutional code that either is readily decodable by the sequential decoder for data recovery, or may be readily decoded (although sub-optimally) by a relatively simple Viterbi decoder. The self-concatenated convolutional code may be generated in the transmitter in either of two exactly equivalent mechanisms: 1) by means of a conventional systematic feedback rate one-half convolutional encoder, or 2) by means of a replacement encoder, which is operative to encode data in accordance with an alternative convolutional encoding mechanism of the type described in an article by H. A. Loeliger, entitled "New Turbo-like Codes," Proceedings of the IEEE International Symposium on Information Theory, Ulm, Germany, Jun. 29–Jul. 4, 1997, p. 109, hereinafter referred to as "Loeliger-codes."

The properties of this alternative Loeliger code reveal that its column distance function will provide good performance when used with a sequential decoder. They also can be generated using a self-concatenated encoder with a small number of states, running at twice the symbol rate, and hence can be decoded (although sub-optimally) using a low-complexity Viterbi decoder also running at twice the symbol rate. Namely, since the same code that produces good data recovery performance using a sequential decoder can also be decoded (although sub-optimally) using a low-complexity (e.g., eight state) Viterbi decoder, a Viterbi decoder may be used as an adjunct to the sequential decoder to improve the statistics during path recovery. This Viterbi decoder can also be used to assist the sequential decoder during normal operation mode. Moreover, since the alternative code is readily generated by means of a conventional encoder, no special encoding is required.

The Viterbi decoder is incorporated in an alternate decoder to which the received signal is applied. The alternate decoder includes a set of three metric calculators, each of which contains four distance calculation sections that compute squared distances to closest points in four co-sets as branch metrics. One of the metric calculators is coupled directly to the received signal, while the received signal is coupled to the remaining two metric calculators through respective $\Delta_u$ and $\Delta_y$ delays. The delayed branch metrics $B_u(i)$ and $B_y(i)$ are combined in a metric combiner. The two resulting branch metrics are associated with odd and even signals and are alternately coupled to the Viterbi decoder, which operates at twice the symbol rate, and generates twice-rate data estimates of vu(j) and vy(j) bits, that are coupled through a rate divider, so that only every other one of outputs vu(j) and vy(j) quasi-recovered data estimates becomes $\hat{u}(i)$ and $\hat{y}(i)$ that is supplied to the syndrome former.

Using the quasi-recovered estimated $\hat{u}$ and $\hat{y}$ bits from the Viterbi decoder, the syndrome former estimates the recovered state and generates an estimate of the validity of the recovered state. Their validity is verified by a path recovery detector, which comprises a cascaded set of delay stages that are summed together and examined in an all zeros detector to determine whether or not the total is all zeros. The path recovery detector effectively operates as a zero error detection filter, which sums a prescribed number of previous syndrome former outputs, and is used as a verification step. When the sum of the previous syndrome former outputs is zero, the contents of the syndrome former, which represent the recovered state for the sequential decoder, are transferred to corresponding stages of the sequential decoder, to set the recovered path origination state for the sequential decoder. Once the sequential decoder has been given a correct origin state, a new origin state will not be required from the syndrome former unless path loss occurs.

Namely, pursuant to the invention, there are two different methods of generating the equivalent trellis code: either using a conventional systematic feedback rate one-half encoder, or using a non-traditional self-concatenated encoder. During normal operation, a sequential decoder is used, which considers the received data stream as being generated by a conventional systematic feedback rate one-half encoder. However, during a path loss condition, the sequential decoder is replaced with a simple Viterbi decoder, which considers the received data stream as being generated by a non-traditional self-concatenated encoder.

The encoder does not change, only the manner in which the decoder views the received data changes. In fact, the encoder is not aware whether the decoder is operating as a sequential decoder (normal operation) or whether the decoder is operating as a simple Viterbi decoder (during path loss). The decoder changes as a result of loss of synchronization (i.e. path loss), which is an inherent processing characteristic of the sequential decoder, rather than due to changing signal conditions. The simple Viterbi decoder operates with a worse error rate than the sequential decoder, but with better error rate than making hard decision on the received data; the lower complexity Viterbi decoder is simply used to initialize the sequential decoder.

This is in stark contrast with the scheme described in the above-referenced Patent to Gilbert et al, which selects only one trellis code at a time from a predetermined set of trellis codes. As pointed out above, Gilbert et al base their code selection on the current signal and noise condition, there being an associated encoder/decoder set for each of the predetermined trellis codes. In addition, the choice of trellis code may change over time as signal and noise conditions change.

BRIEF DESCRIPTION OF THE DRAWINGS

FIG. 7 shows the column distance function of a first (M=13) alternative convolutional encoding mechanism of the present invention;

FIG. 8 shows the column distance function of a second (M=16) alternative convolutional encoding mechanism of the present invention;

DETAILED DESCRIPTION

Figure 1:
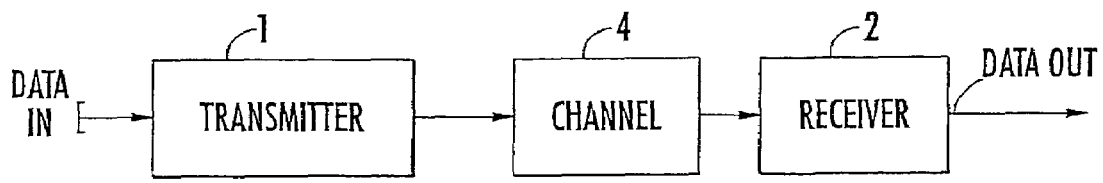
FIG. 1 is a simplified diagrammatical illustration of an encoded digital communication system.

Before describing in detail the sequential decoder search path recovery scheme of the present invention, it should be observed that the invention resides primarily in what is effectively a prescribed arrangement of conventional communication circuits and associated digital signal processing components and an attendant supervisory control program therefor, that controls the operations of such circuits and components. Consequently, the configuration of such circuits and components and the manner in which they are interfaced with other communication system equipment have, for the most part, been illustrated in the drawings by readily understandable block diagrams, which show only those specific details that are pertinent to the present invention, so as not to obscure the disclosure with details which will be readily apparent to those skilled in the art having the benefit of the description herein. Thus, the block diagram illustrations and associated flow charts to be described are primarily intended to show the major components of the system in a convenient functional grouping and processing sequence, whereby the present invention may be more readily understood.

In order to facilitate an appreciation of the Viterbi-decodable, concatenated encoding mechanism employed by the sequential decoding scheme of the present invention for path recovery, it is initially useful to review the properties and functionality of trellis-coded encoding/decoding mechanisms that have been and are currently employed for bandwidth-efficient coded modulation, in digital data communication systems, such as but not limited to HDSL.

As pointed out briefly above, one of the problems with the sequential decoding of TCM signals is the time involved to recover from a loss of synchronization. Because sequential decoding searches only one path through the code tree at a time—compared with Viterbi decoding, which searches all paths—the average number of computations for a sequential decoder is much lower than for Viterbi decoding. However, if the sequential decoder determines that it is following an incorrect path, it must back up and try other paths until the correct path is found.

The number of computations required for a sequential decoder to find the correct path is therefore a random variable, and may occasionally be quite high. Since actual implementations only allow a fixed number of computations over a given time interval, the sequential decoder will occasionally fail to find the correct path within the specified computational limit. This failure to find the correct path within the time limit is known as 'path loss' or 'loss of synchronization'.

When a sequential decoder encounters path loss, the traditional approach for originating state recovery is to begin making hard decisions on the received symbols. During this path recovery mode of operation, the sequential decoder is searching for the correct starting state of the trellis code path, in order that sequential decoding can resume.

The correct state of the sequential decoder can be inferred once "M" successive correct hard decisions have been made. Unfortunately, the waiting time for a sufficiently long run of error-free channel output symbols is excessively long under normal operating conditions, as the error probability of the hard decisions can be very high—for example on the order of ten to twenty percent. This means that the probability of finding "M" successive correct decisions is rather low, and increases the amount of time searching for "M" correct decisions in a row.

A $2^M$-state N-dimensional TCM code adds one bit for coding per N signal dimensions relative to uncoded transmissions. This means that for a TCM code to achieve coding gain, it must first make up the 6/N dB loss associated with the addition of one coding bit per N dimensions, plus whatever additional coding gain (denoted CodingGain) is achievable by the code.

Therefore, hard decisions on a TCM signal will have 6/N+CodingGain dB worse performance than the decoder decisions themselves. The lower the dimensionality of the code, the worse the recovery performance. For example, hard decisions on a N=1 dimensional TCM signal with a CodingGain of 5 dB will be 11 dB worse than the decoder decisions.

As pointed out above, the present invention remedies these problems by encoding the data at the transmit site by means of a prescribed form of concatenated convolutional code, which is decoded by a sequential decoder and optimizes data recovery, on the one hand, or it may be readily decoded suboptimally by relatively simple Viterbi decoder, and thereby expedite path recovery, on the other hand. As non-limiting but preferred examples, the concatenated code employed in the method and apparatus of the present invention may be of the type described in the previously referenced article by H. A. Loeliger, entitled "New Turbo-like Codes," Proceedings of the IEEE International Symposium on Information Theory, Ulm, Germany, Jun. 29–Jul. 4, 1997, p. 109. and referred to herein as "Loeliger-codes." During path recovery mode, the normal operation of the sequential decoder is interrupted, and instead is decoded in an alternate Viterbi decoder-based path recovery signal processing scheme, to derive a quasi-recovered data estimate, which improves the statistics of the decisions, and therefore dramatically decreases the time to find "M" successive correct decisions.

Figure 2:
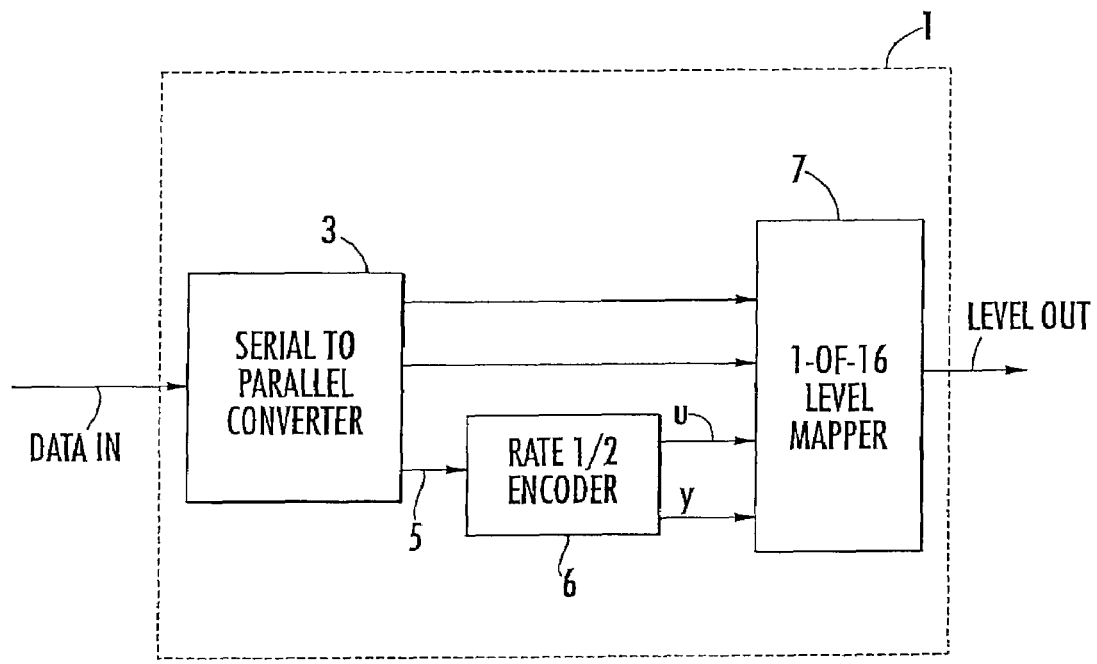
FIG. 2 such a trellis coded modulator that may be employed in the transmitter device of the encoded digital communication system of FIG. 1.
Figure 3:
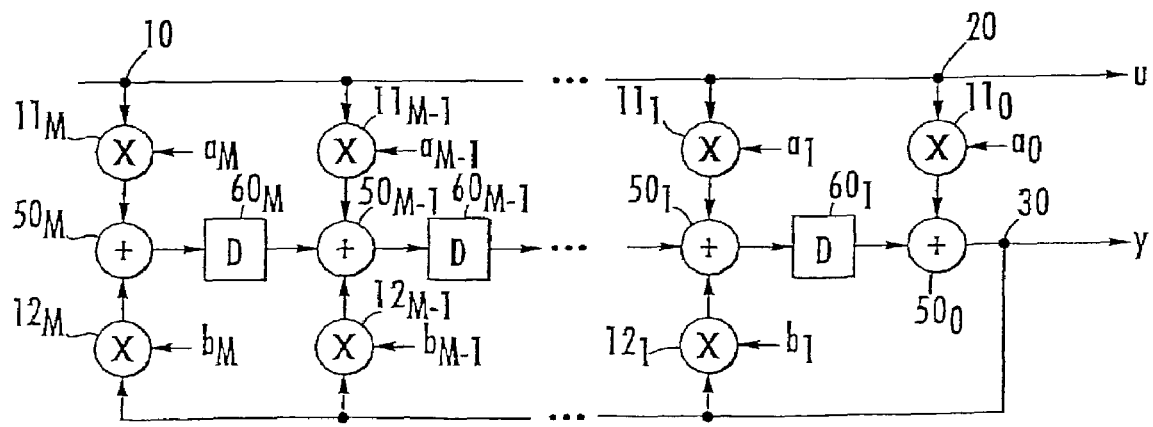
FIG. 3 diagrammatically illustrates the general configuration of a conventional systematic feedback rate one-half convolutional encoder.

FIG. 3 diagrammatically illustrates the general configuration of a conventional systematic feedback rate one-half convolutional encoder, such as may be employed for the rate one-half encoder 6 of the trellis coded modulator of FIG. 2, described above. Such a conventional rate one-half encoder has an input node 10 to which a stream of binary data bits to be encoded is applied, and a pair of output nodes 20 and 30 from which respective encoder output bits u and y are derived for each input data bit. The encoder has a feedforward path through a distributed plurality of feedforward (multiplier) weighting stages $11_M$, $11_{M-1}$, . . . , $11_0$ that modify or weight the value of the input bit by respective feedforward coefficients $a_M$, $a_{M-1}$, $a_1$, $a_0$. The weighting stage outputs are coupled to first inputs of respective modulo-2 adders $50_M$, $50_{M-1}$, . . . , $50_1$, $50_0$.

This encoder also has a feedback path through a distributed plurality of feedback (multiplier) weighting stages $12_M$, $12_{M-1}$, . . . , $12_1$, that modify or weight the value of output bit y by respective feedback coefficients $b_M$, $b_{M-1}$, . . . , $b_1$, ($b_o$≠1), the outputs of which are coupled to second inputs of the respective logic combining stages $50_M$–$50_1$. The outputs of the logic combining stages $50_M$–$50_1$ are coupled through respective delay (D) stages $60_M$–$60_1$, to further inputs of the logic combining stages $50_{M-1}$–$50_0$.

The standard encoder of FIG. 3 may be conveniently specified by the binary representation of the integers:

$$a \triangleq \sum_{i=0}^{M} a_i 2^i$$

$$b \triangleq \sum_{i=0}^{M} b_i 2^i$$

In the present description, which disregards finite-constellation effects, the signal set is simply the set of integers or a translated version thereof. As a non-limiting example, the transmitted data value may be defined by the expression: 4z+2u+y+const, where u and y are the respective encoder output bits at output nodes 20 and 30, interpreted as the integers 0 or 1, where const is a fixed constant (typically const=0 or const=0.5), and z is an arbitrary integer that represents "uncoded" bits. As described in an article by G. Forney, entitled "Geometrically Uniform Codes," IEEE Transactions on Information Theory, Vol. 37, pp 1241–1260, September 1991, if the binary code is linear, this mapping yields a geometrically uniform signal-space code.

The performance of a given code with respect to sequential decoding is primarily determined by its column distance function $cd_0$, $cd_1$, $cd_2$, . . . , where (for linear codes and for geometrically uniform codes) the i-th column distance $cd_i$ is the minimum weight of any length i+1 codeword segment (where "length" refers to the number of trellis branches) that leaves the zero state at time zero. For Euclidean-space applications, "weight" means the squared Euclidean distance to the zero branch. For the binary-to-signal-space mapping defined by the above expression, the branch weight is 0 for branches with u=0 and y=0, 4 for u=1 and y=0, and 1 for the other two cases. For these weights, the optimum (i.e., fastest growing) distance function is tabulated in FIG. 4.

Figures 4, 5, 6:
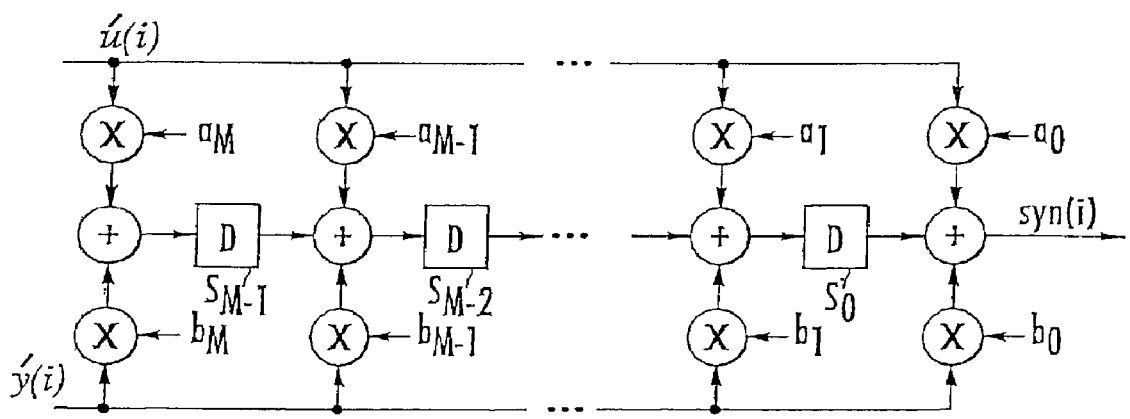
FIG. 4 tabulates an optimum (i.e., fastest growing) distance function for a convolutional code.
FIG. 5 diagrammatically illustrates a syndrome former.
FIG. 6 tabulates numerical results for an average waiting time $L_{av}$, and waiting time $L_{0.9}$ for a syndrome-based path-recovery mechanism.

A standard technique for generating an estimate of the originating state of a sequential decoder that decodes an encoded sequence generated by the rate one-half convolutional encoder of FIG. 3 is to feed hard decisions of the u-bits and the y-bits into a syndrome generator or syndrome former of the type shown in FIG. 5. A long string of zeros in the output syn(i) of the syndrome generator indicates that there was a long string of u and y bits from the hard-decision estimates, which were correct.

The syndrome generator has respective feedforward paths for each of the u and y bits containing the a and b weighting coefficients of the encoder of FIG. 3, plus a $b_0$ coefficient weighting (multiplier) stage, as shown. If the u(i) and y(i) bit inputs to the syndrome generator correspond to the error-free u and y outputs of the convolutional encoder of FIG. 3, the state of the syndrome generator tracks (i.e., equals at all times) the state of the encoder and the output syn(i) of the syndrome generator is an all-zeros sequence. In fact, as soon as "M" consecutive input bit pairs to the syndrome generator are error-free code symbols, the syndrome generator will be in the same state as the encoder.

For some value L, a run of L consecutive zeros may be observed at the output of the syndrome generator, as a result of one of two possibilities. The consecutive "0" sequence has either happened by chance from "random" channel symbols; or the syndrome generator was fed with a run of L+M error-free u-y pairs and is now in the same state as the encoder. For a better discrimination of these cases, the input to the syndrome generator can be traced back, from its supposedly known final state, and it can be determined whether the past L+M number of u-y pairs are consistent with a code sequence that ends in that state. If these L+M symbols are found to be consistent with the final state, the likelihood that the encoder state has been recovered is higher than from the L zeros alone.

The performance of any syndrome-based path-recovery mechanism strongly depends on the probability that L+M consecutive channel symbols are received error-free. At 22.5 dB with a one-dimensional sixteen-point constellation, the hard-decision symbol error probability is 0.148. For this symbol error rate, FIG. 6 tabulates numerical results for the average waiting time $L_{3v}$, as well as the waiting time $L_{0.9}$ for a success probability of 0.9. Note that $L_{0.99}=2L_{0.9}$, $L_{0.999}=3L_{0.9}$, and so on.

In accordance with the present invention, data to be transmitted over the channel and decoded by a sequential decoder is encoded by means of a conventional systematic feedback rate one-half convolutional encoding mechanism having parameters M=13, a=027776, and b=013773 (as shown in FIG. 3, a and b in octal). Its column distance function is shown in FIG. 7. The squared Euclidean free distance is 20. A particularly advantageous feature of this code, in addition to its attractive column distance function which makes it a good candidate for sequential decoding, is the fact that it can also be viewed as having a self-concatenated construction, such that it is readily decoded suboptimally by a relatively simple Viterbi decoder, for path recovery.

Figure 9:
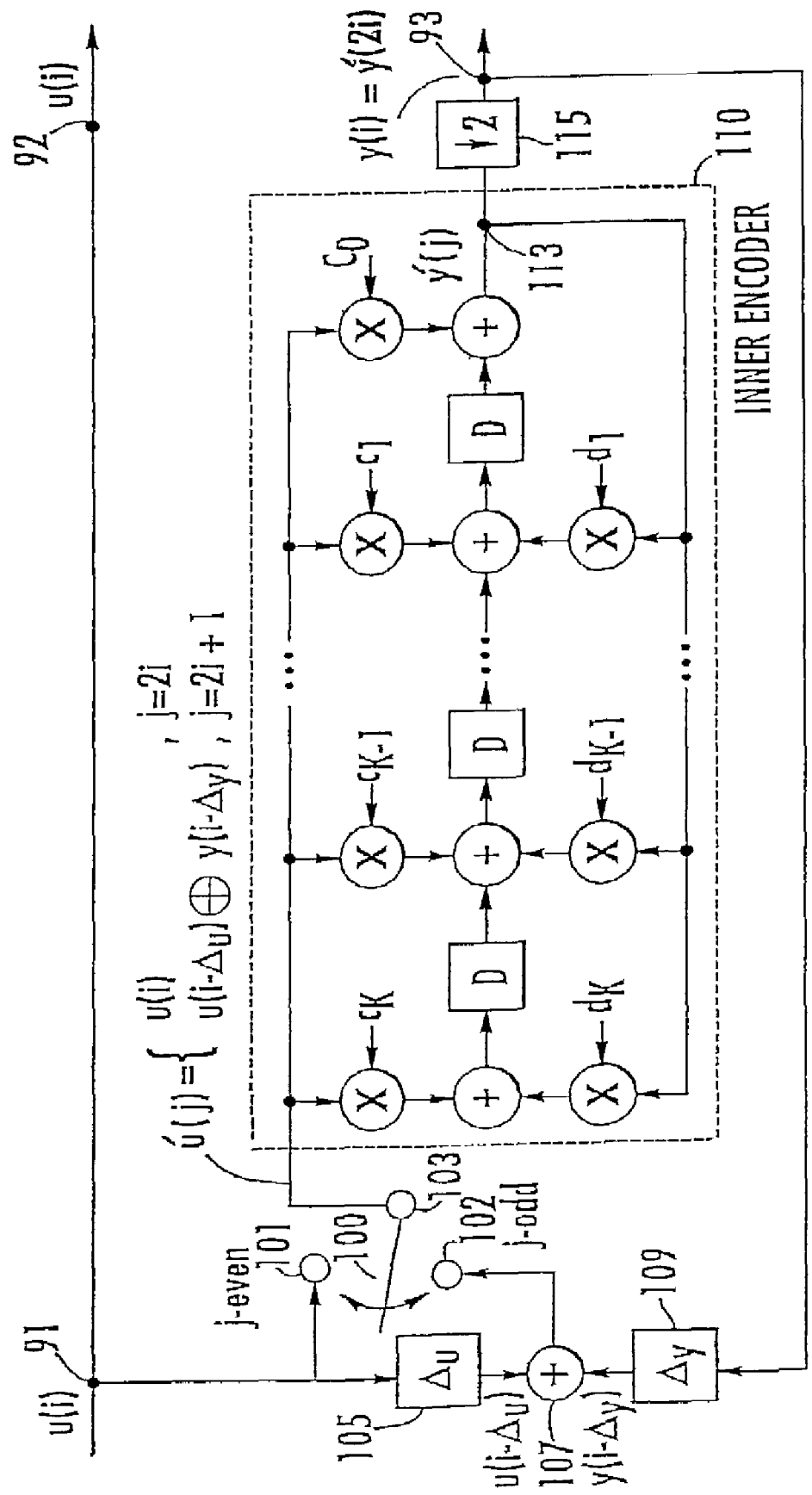
FIG. 9 diagrammatically illustrates an alternative encoder employed in the present invention.

This feature of the code may be readily understood by starting with an 8-state binary convolutional code of K=3 and coefficients c=06 and d=015 (octal), for a convolutional encoder of the form diagrammatically illustrated in FIG. 9. The inner decoder 110 of FIG. 9 may be conveniently specified by the binary representation of the integers c and d as:

$$c = \sum_{i=0}^{K} c_i 2^i, \; d = \sum_{i=0}^{K} d_i 2^i$$

In this encoding scheme, u(i) and y(i), i=0, 1, 2, . . . are the output bits of the original ("large") encoder, and ú(j) and ý(j), j=0, 1, 2, . . . are the output bits of the 8-state encoder. Such an 8-state encoder operates at twice the speed of the original encoder.

For j even, the 8-state encoder is fed with the same input as the original encoder, namely: ú(2i) $\triangleq$ u(i). For j odd, the 8-state encoder is fed with the sum of an "old" information bit and an "old" parity bit as:

$$\acute{u}(2i+1) \triangleq \acute{u}(2i+1-23) + \acute{y}(2i+1-21)$$
$$= \acute{u}(2(i-11)) + \acute{y}(2(i-10))$$
$$= u(i-11) + \acute{y}(2(i-10)).$$

(For i<0, all bits are defined to be zero.) It then follows that ý(2i)=y(i).

In other words, the "even" outputs ú(2i) and ý(2i), i=0, 1, 2, . . . of the 8-state encoder equal the outputs of the original encoder. The inputs ú(2i+1) and the parities ý(2i+1) are not transmitted. This may be readily verified by comparing the output sequences that result from encoding a single one bit at time zero (i.e., u(0)=1 and u(i)=0 for i≠0). The above code was located by a search of all encoding rules for the above expressions, over all 8-state codes and over all choices of the re-used bits, with subsequent identification of the "large" encoder from the resulting impulse response. In the course of examination of many different codes, one other code with a similarly attractive column distance function was found. This additional code has the parameters M=16, a=02, and b=0220015 (octal). Its column distance function is tabulated in FIG. 8. The squared Euclidean free distance is 21.

The concatenated construction of this additional code may be defined as follows. The 8-state binary convolutional code is the same as that for the first code described above, namely: K=3, c=06, and d=015 (octal). Using the notation set forth above, the encoding definition may be defined as:

$$\acute{u}(2i) \triangleq u(i); \text{ and}$$

$$\acute{u}(2i+1) \triangleq \acute{y}(2i+1-25) + \acute{y}(2i+1-27)$$

$$= \acute{y}(2(i-12)) + \acute{y}(2(i-13)).$$

It may be noted that in contrast to the first code, the odd-time ú-bits of this second code are formed by summing two parity bits (rather than an old u bit and an old ý-bit), which must be taken into account in the branch metric computation of the Viterbi decoder. Also, this second encoding definition contains two Δy time differentials, Δy 1=12 and Δy 2=13, rather than Δu and Δy time differentials, as before. As with the first code, ý(2i)=y(i). It is also possible to make the 8-state code time-varying with period 2, which would yield an overall time-invariant rate ½ code. A much larger search space, and thus potentially many better codes, may be obtained when the overall code is allowed to be time-varying (periodic), as occurs naturally from the use of more traditional concatenations.

Advantageously, the 8-state inner code portion of the alternative code can be readily decoded by a Viterbi decoder, with only a slight modification from standard applications. In order to facilitate the present description, in the following discussion, Viterbi decoding of the first code (M=13) will be described; Viterbi decoding of the second code (M=16) will be readily understood from the description of decoding the first code.

The Viterbi decoder processes two trellis sections per transmitted u-y pair (i.e., per channel dimension). For each such pair, the branch metrics of the first trellis section are computed conventionally from the received channel output. The branch metrics of the second section, however, are computed from the two channel symbols received ten and eleven dimensions earlier, as denoted in the foregoing expressions. For both cases, the branch metric computation is illustrated by the pseudocode (in C++ notation) below. In the pseudocode, the branch metrics are contained in an array bm[0 . . . 3], which is indexed by u-y pairs in a customary manner (2u+y). It may also be observed that the Viterbi decoder will produce estimates of all u-y pairs—not just of u-bits—since a syndrome cannot be generated without the parity bits.

The branch metric computation for the first trellis section (in C++ notation) is defined as follows:

```
void cosetSqrDist (double received, double bm[] ) {
    for (int i=0; i<4; i++) {
        double dist = abs (received - i) mod 4;
        if (dist>2) dist = 4 - dist;
        bm[i] = dist y dist;
    }
}
```

The branch metric computations for the second trellis section (in C++ notation) are set forth below. The arguments received_11 and received_10 are the received channel output at times i-11 and i-10, respectively, where the counting refers to channel dimensions (and not to the double-speed time axis used to describe the concatenated construction), as set forth in the above expressions.

```
void branchMetricsUY (double   received_11, double
received_10, double bm [] {
    double dist [4]
    cosetSqrDist (received_11, dist);
    double du0 = min (dist [0], dist [1] ) ; // old u
 = o
    double du1 = min (dist [2], dist [3] ); // old u
 = 1
    cosetSqrDist (received_10, dist);
    double dy0 = min (dist [0], dist [2] ); // old y
 = o
    double dy1 = min (dist [1], dist [3] ); // old y
 = 1
    bm [0] = bm [1] = min( du0+dy0, du1+dy1 ); //
current u=0
    bm [2] = bm [3] = min( du0+dy1, du1+dy0 ) ; //
current u=1
```

A non-limiting example of an embodiment of the sequential decoder search path recovery scheme of the present invention will now be described with reference to FIGS. 9–15. FIG. 9 diagrammatically shows a modification of the transmitter, in particular, an alternative or replacement encoder that is equivalent to and is substituted for the conventional systematic feedback rate one-half convolutional encoder of FIG. 3 in the trellis coded modulator of FIG. 2.

This replacement encoder of FIG. 9 is operative to encode data in accordance with the first (M=13) alternative, self-concatenated code described above, and as such can be readily decodable by a sequential decoder for data recovery, or readily decoded by relatively simple Viterbi decoder, for path recovery.

For this purpose, the alternative encoder of FIG. 9 has an port 91 to which an input u(i) is applied, and first and second output ports 92 and 93 from which outputs u(i) and y(i) are derived. The input port 91 is coupled directly to the first output port 92 and to a first terminal 101 of a toggled switch 100, the output terminal 103 of which is toggled between terminal 101 and a second input terminal 102. The input u(i) is further coupled through a $\Delta_u$ delay 105 to a first input of a modulo-2 adder 107. A second input of modulo-2 adder 107 is coupled through a $\Delta_y$ delay 109 of a feedback path from output node 93. The output of the modulo-2 adder 107 is coupled to the input terminal 102 of switch 100.

The output terminal 103 of toggled switch 100 is coupled as an input ú(j) to an input port 111 of an inner encoder 110, which has the same architecture as that of the rate one-half encoder of FIG. 3, but operates at twice its speed and employs a different set of parameters. The input ú(j) corresponds to the input u(i) applied to input port 91, where j is even (j=2i), and corresponds to the output of the modulo-2 adder 107, where j is odd (j=2i+1). The output ý(j) at the output port 113 of the inner encoder 110 is coupled through a rate divider 115, so that only every other output ý(j) at the output port 113 of the inner decoder 111 is passed to the output port 93, so as to produce the output y(i)=ý(2i) at the output port 93.

The alternative encoder of FIG. 9 may be made functionally equivalent to the encoder of FIG. 3 by an appropriate choice of the variables $a_i$, $b_i$, $c_i$, $d_i$, $\Delta_u$ and $\Delta_y$. For this purpose, as pointed out above, in accordance with a first, non-limiting example, $a_{13}a_{12} \ldots a_0$=027776 octal, $b_{13}b_{12} \ldots b_0$=013773 octal, $c_3c_2c_1c_0$=06 octal, $d_3d_2d_1d_0$=015 octal, $\Delta_u$=11 and $\Delta_y$=10. Namely, for this set of parameters, given the same input, each of the respective encoders of FIGS. 3 and 9 will produce the same output.

The alternative encoder of FIG. 9 operates as follows. At each symbol time, one bit u(i), is input to input port 91 and two bits u(i) and y(i) are produced at respective output ports 92 and 93. The symbol time index, i, increments once each symbol time. The inner encoder 110, however, operates at a rate which is twice the symbol rate, and hence twice each symbol time one bit ú(j) is input at port 111 and one bit ý(j) is output from port 113.

The inner encoder's time index, j, increments twice each symbol time. For a given symbol index, i, the two inner encoder indices are j=2i and j=2i+1. For j even, the inner encoder's input is ú(j)=ú(2i)=u(i). For j odd, the inner encoder's input is ú(j)=ú(2i+1)=u(i−$\Delta_u$)⊕y(i−$\Delta_y$). As note above, only every other output ý(j) produced at the inner encoder output port 113 is passed to the output port 93 of the alternate encoder, so that the output y(i)=ý(2i)

As described previously, the properties of a "Loeliger-code" reveal that the column distance function will provide good performance when used with a sequential decoder. For the standard encoder of FIG. 3, such a code corresponds to an M=13 or $2^{13}$=8192-state convolutional code, which is too large to be decoded by a Viterbi decoder of reasonable complexity. However, the alternate encoder configuration of FIG. 9 allows a Loeliger-code to be generated using a K=3 or $2^3$=8-state encoder, running at twice the symbol rate, and hence can be decoded (although sub-optimally) using a low-complexity 8-state Viterbi decoder. Namely, since the same code that produces good data recovery performance using a sequential decoder can also be decoded (although sub-optimally) using a low-complexity (e.g., eight state) Viterbi decoder, a Viterbi decoder may be used as an adjunct to the sequential decoder to improve the statistics during path recovery. Moreover, since the code is readily generated by means of a conventional encoder, no special encoding is required.

Figure 10:
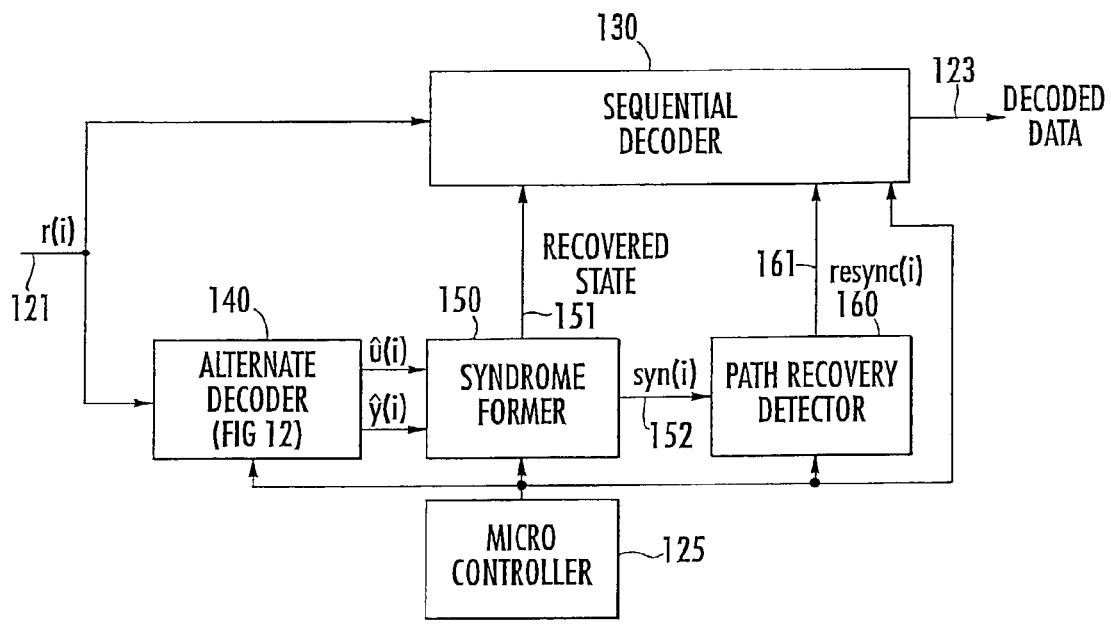
FIG. 10 diagrammatically illustrates a channel receiver in accordance with the present invention.

A channel receiver in accordance with the present invention is diagrammatically illustrated in FIG. 10. The channel receiver includes a supervisory microcontroller 125, that controls the operation of the receiver, including path loss recovery using the rapid resynchronization sequence shown in the flow chart of FIG. 15 to be described. The channel receiver includes an input port 121 to which a received signal r(i) is applied. Input port 121 is coupled to a serial input 131 of a standard sequential decoder 130, which takes in the received signal r(i) and outputs decoded data at its output port 133. As described above, in order to effect data recovery, the sequential decoder 130 must have the correct state to use as the origin node of the path that is being searched. The receiver input port 121 is further coupled to a Viterbi decoder-based alternate or auxiliary, path recovery decoder 140 to be described below with reference to FIGS. 12–14.

The alternate decoder 140 generates estimated û and ŷ bits from the received signal r(i), and couples two outputs û(i) and ŷ(i) to a syndrome former 150, which may be configured as shown in FIG. 5, described above. Using the estimated û and ŷ bits from the alternate decoder 140, the syndrome former 150 estimates the recovered state and generates an estimate of the validity of the recovered state (indicated by the signal syn(i)), as described above. Once their validity has been verified, the contents of the respective stages $S_{M-1}$, $S_{M-2}$, ..., $S_0$ of syndrome former 150 are coupled over link 151 to the corresponding stages of the sequential decoder 130, to set the recovered path origination state for the sequential decoder.

Figure 11:
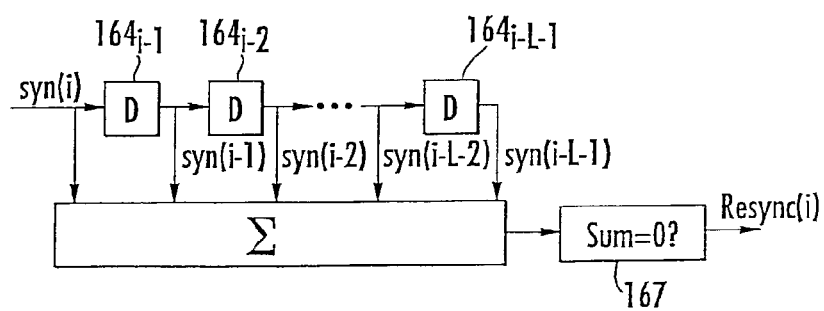
FIG. 11 diagrammatically illustrates a path recovery detector.

The output syn(i) of the syndrome generator 150 is coupled over link 152 to a path recovery detector 160, shown in FIG. 11, to be described. The path recovery detector 160 serves to improve the estimate of the validity of the recovered state. When the path recovery detector 160 has determined that the recovered state is correct, it generates the signal resync(i), which is coupled over link 161 to the sequential decoder 130. Once the sequential decoder 130 has been given a correct origin state, a new origin state will not be required from the alternate decoder 140, the syndrome former 150, and the path recovery detector 160 unless path loss occurs.

Figure 12:
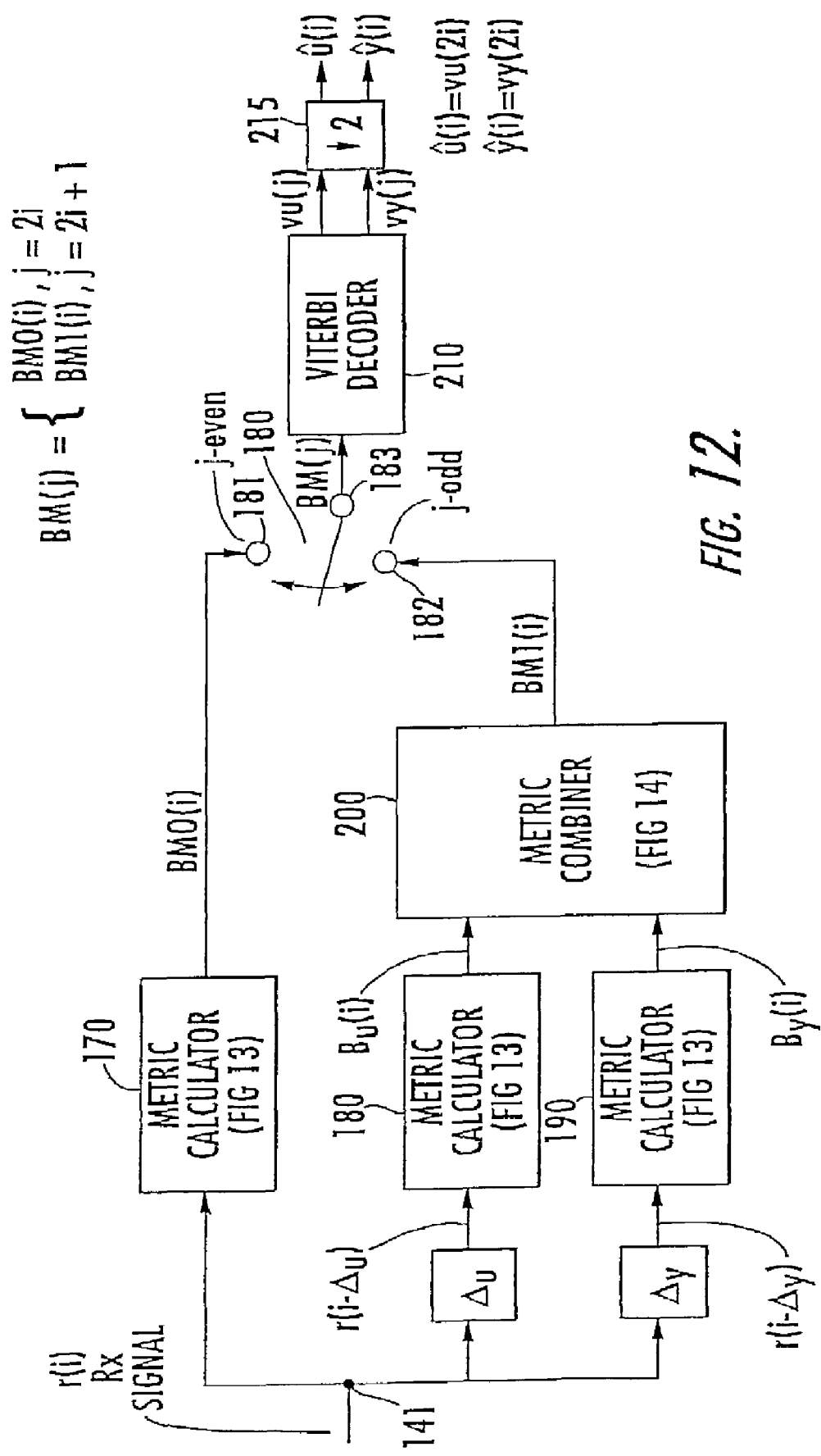
FIG. 12 diagrammatically illustrated the architecture of a Viterbi decoder-based alternate decoder.
Figure 13:
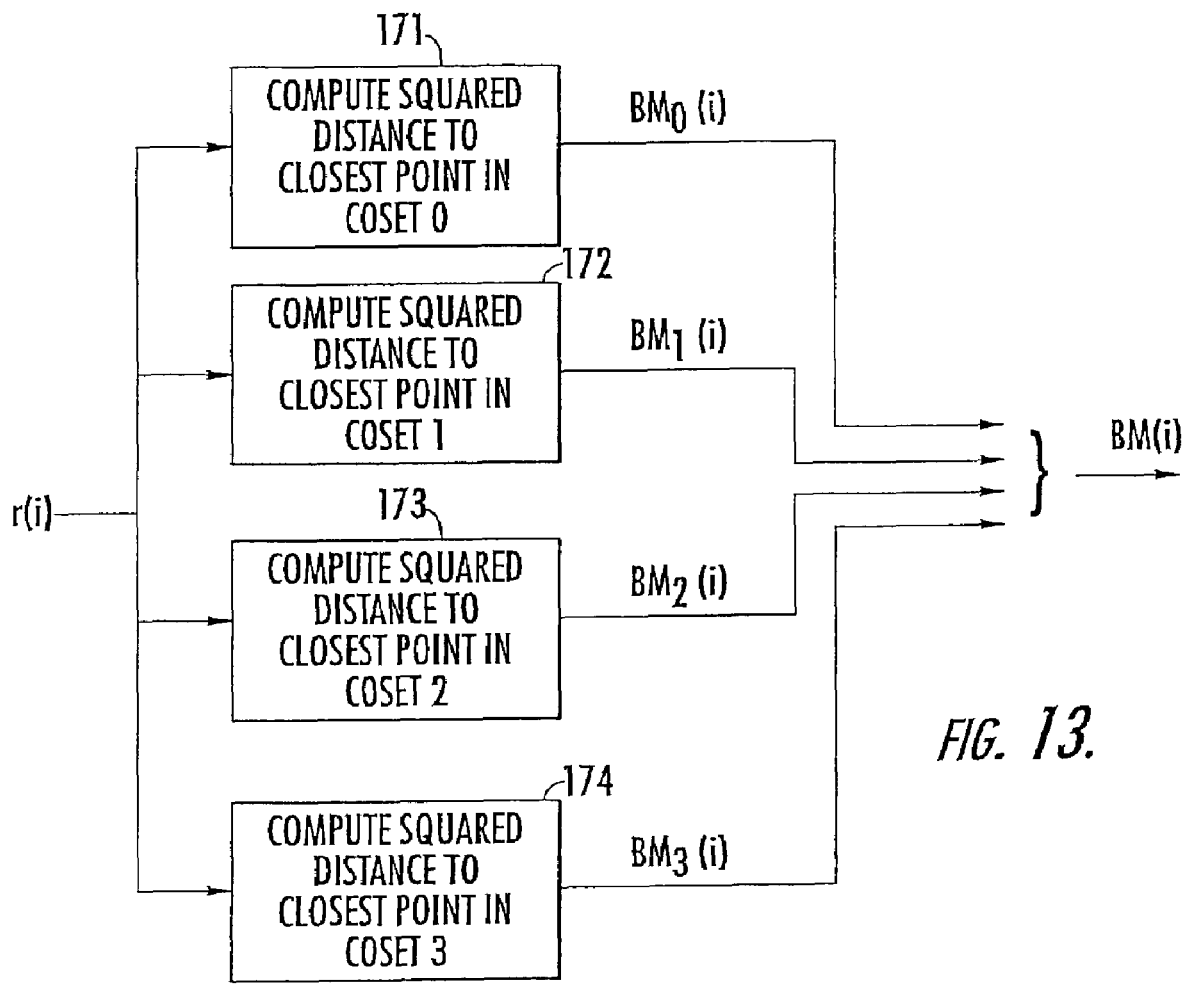
FIG. 13 shows the signal processing carried out by a metric calculator of the alternate decoder of FIG. 12.

The architecture of the low-complexity (e.g., eight state) Viterbi decoder-based alternate decoder 140 is diagrammatically illustrated in FIG. 12 as comprising an input port 141 to which the received signal r(i) is applied. Decoder 140 is digital signal processor based, and has port 141 thereof coupled to a metric calculator 170, the signal processing operation of which is shown in FIG. 13. As shown therein, the metric calculator 170 contains four distance calculation sections 171–174, that compute the squared distances to the closest points in the four co-sets 0–3, as branch metrics $BM_0(i)$, $BM_1(i)$, $BM_2(i)$ and $BM_3(i)$, respectively, which are coupled to a first (j-even) terminal 181 of a toggled switch 180.

The received signal r(i) at port 141 is further coupled through a $\Delta_u$ delay 142 and a $\Delta_y$ delay 143 to respective metric calculators 180 and 190 which, like metric calculator 170 are configured as shown in FIG. 13. The output of metric calculator 180 is a branch metric $B_u(i)$ and output of metric calculator 190 is a branch metric $B_y(i)$. These branch metrics are calculated based on the received signal delayed by $\Delta_u$ and $\Delta_y$, for j-odd. The delayed branch metrics $B_u(i)$ and $B_y(i)$ for j odd are combined in a metric combiner 200.

Figure 14:
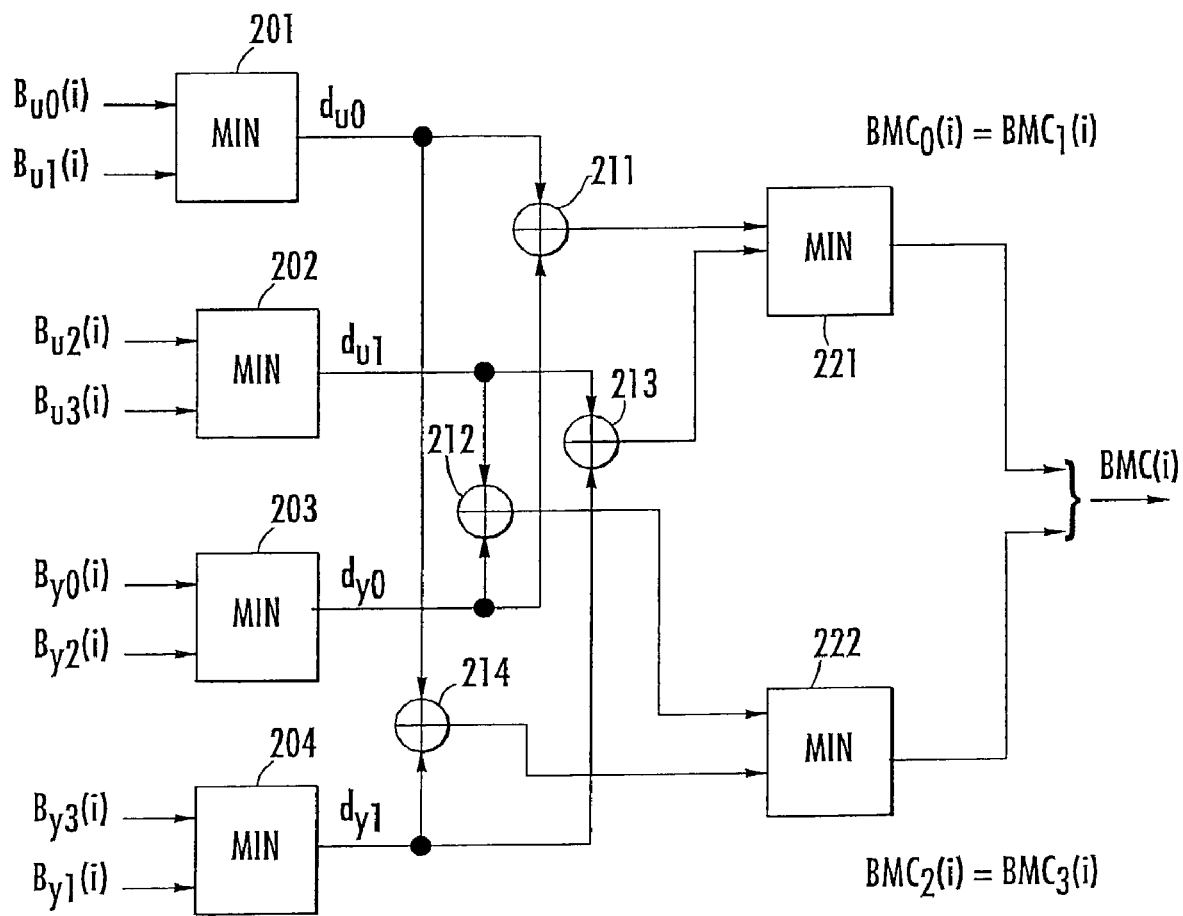
FIG. 14 diagrammatically illustrates a metric combiner of the alternate decoder of FIG. 12.

As shown in FIG. 14, metric combiner 200 contains a set of minimum value calculators 201–204 that determine the minimum distance (MIN) from four sets of paired branch metric inputs $B_{u0}i/B_{u1}i$; $B_{u2}i/B_{u3}i$; $B_{y0}i/B_{y2}i$; $B_{y1}/B_{y3}$ as minimum distance values $d_{u0}$, $d_{u1}$, $d_{y0}$, $d_{y1}$. These minimum distance values $d_{u0}$, $d_{u1}$, $d_{y0}$, $d_{y1}$ are then applied to adders 211–214, the outputs of which are applied in pairs to minimum value calculators 221 and 222, to produce two sets of branch metric values $BMC_0(i)$=$BMC_1(i)$ and $BMC_2(i)$=$BMC_3(i)$. These branch metrics are coupled to a second (j-odd) terminal 182 of a toggled switch 180. At the output terminal 183 of switch 180, the $k^{th}$ output $BM_k(i)$ at symbol time (i) is the squared Euclidean distance between the input of the branch metric calculator at time i and the closest point in subset k. For j even, a branch metric BM(j) is calculated based on the received signal r(i) at time (i).

The branch metrics are coupled to a Viterbi decoder 210, which generates respective estimates vu(j) and vy(j) of the u and the y bits for each value of j. As in the case of the inner encoder 110 of FIG. 9, the Viterbi decoder 210 operates at twice the symbol rate. The estimates vu(j) and vy(j) are coupled through a rate divider 215, so that only every other one of outputs vu(j) and vy(j) is supplied as quasi-recovered data estimates û(i) and ŷ(i) to the syndrome former 150.

As pointed out above, the syndrome former 150 takes the estimates of the u and y bits from the alternate decoder (û(i) and ŷ(i)) and generates an estimate of the correct state to recover the path of the sequential decoder 130. A long string of zeros in the output (syn(i)) of the syndrome former 130 indicates that there was a long string of u and y bits from the alternate decoder 140 which were correct.

The output of the syndrome 150 is coupled to the path recovery detector 160 which, as shown in FIG. 11, comprises a cascaded set of delay stages $164_{i-1}, \ldots, 164_{i-L-1}$, outputs syn(i−1) . . . syn(i−L−1) of which are summed together in an adder or summation stage 165. The contents of summation stage 165 are examined in all zeros detector logic 167 to determine whether or not the total is all zeros. In effect, therefore, the path recovery detector 160 operates as a zero error detection filter, which sums the previous L syndrome former outputs, and is used as a verification step. When the sum of the previous L syndrome former outputs is zero, the output of the all zeros detector logic 167 changes state, indicating that the last L+M alternate decoder decisions were correct, and the contents of the syndrome former $(S_{M-1}S_{M-2} \ldots S_0)$ represent the recovered state for the sequential decoder 130. As pointed out above, the recovered state of the syndrome generator 150 serves as the originating node of the recovered path of the sequential decoder 130.

Figure 15:
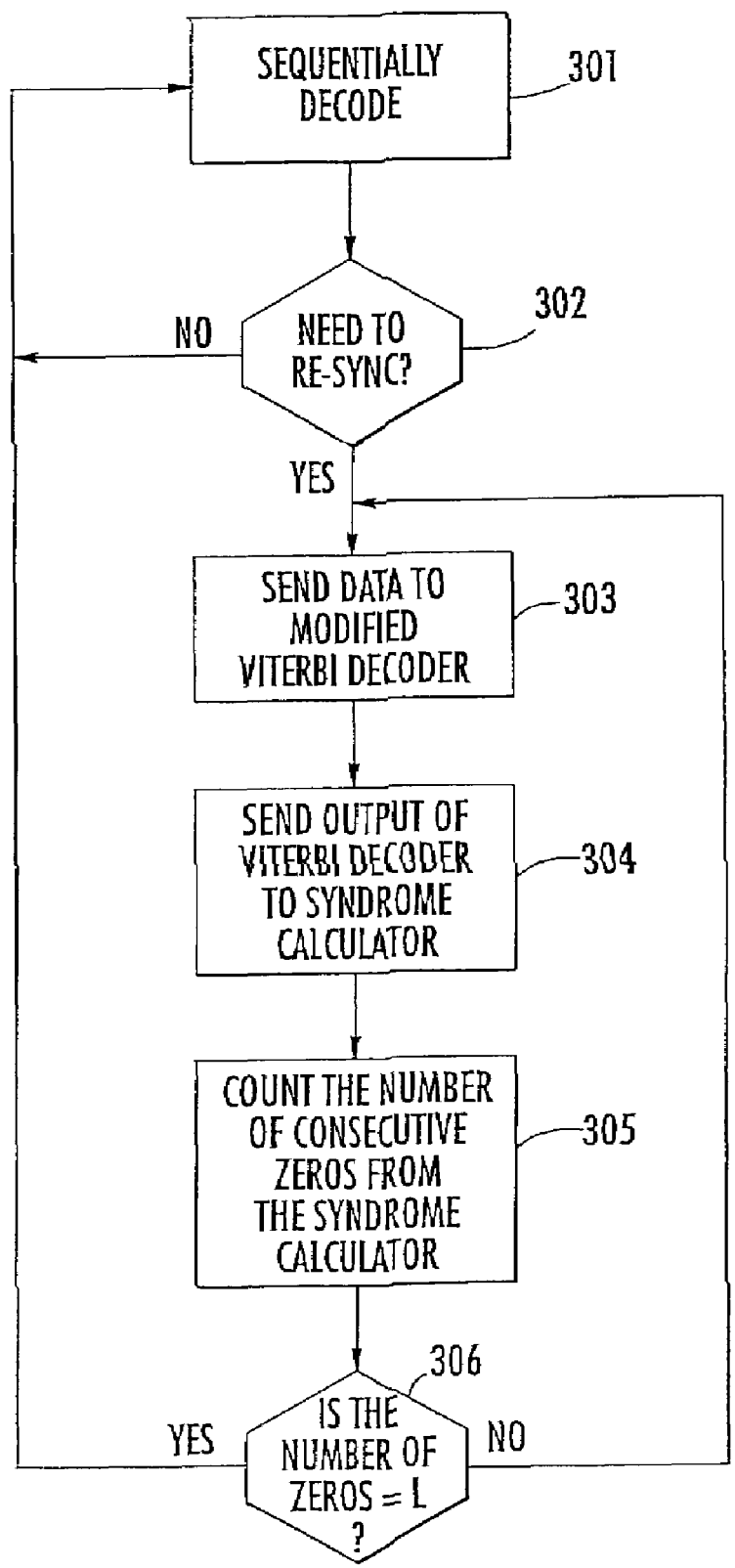
FIG. 15 is a flow chart showing respective steps of the path loss recovery routine executed by the channel receiver of FIG. 10.

Referring now to FIG. 15 the respective steps of the path loss recovery or rapid resynchronization routine that is executed by the channel receiver microcontroller are shown as including a first step 301, in which the receiver's sequential decoder 130 is decoding data as it is received at receive port 121. As long as the received encoded data stream is being successfully decoded and data recovered, the answer to a need to re-sync step 302 is NO, and the sequential decoder continues 130 to sequentially decode the received encoded data. However, in the event of a loss of synchronization (the answer to step 302 is YES), the control routine transitions to step 303, in which, rather than being decoded by the sequential decoder, the received data path from the receiver input port 121 is diverted to the alternate decoder 140, causing its Viterbi decoder to provide quasi-recovered data estimates of the received signal, as described above.

In step 304 of this path recovery mode, the Viterbi decoder's quasi-recovered data estimates on the received data produced by the alternate decoder 140 are coupled to the syndrome generator 150, which processes the estimates from the Viterbi decoder and couples its output syn(i) to the path recovery detector 160. In step 305, the path recovery detector 160 counts the number of zeros. This number is examined in query step 306, to determine whether the sum of the previous L syndrome former outputs is zero. If the answer to query step 306 is NO, the routine transitions to step 303. If the answer to query step 306 is YES, indicating that the last L+M alternate decoder decisions (although less than optimal for data recovery, but useful for path recovery) were correct, the output of the path recovery detector 160 changes state, causing the respective stages of the sequential decoder 130 to be loaded with the contents of the stages $(S_{M-1}S_{M-2} \ldots S_0)$ of the syndrome former 150 as the recovered state. The routine then returns to step 301, wherein operation of the 'path recovered' sequential decoder is resumed.

A simulation of the improved path recovery mechanism of the present invention described above was performed, and statistics associated with consecutive correct decisions were derived as outputs of the simulation. For the first alternative code (M=13), and using the alternate decoder-based path recovery scheme of the invention, and with a signal-to-noise ratio of 22.5 dB, the probability that more than 200 symbols are required to find 25 correct decisions in a row is on the order of 0.03. If hard decisions were used instead of the alternate decoder of the invention, the probability that more than 200 symbols are required to find 25 correct decisions in a row is on the order of 0.6 (or twenty times higher). It will be readily appreciated therefore that there is more than an order of magnitude improvement in the probability of correct detection using the alternate decoding mechanism of the invention.

From another perspective, the number of symbols that must be processed in order to achieve a 90% probability of finding 25 correct decisions in a row using the improved path recovery mechanism of the invention with an M=13 Loeliger code is 133. If hard decisions are used instead of the alternate decoder of the invention, then the number of symbols that must be processed in order to achieve a 90% probability of finding 25 correct decisions in a row is 812. Thus, the time required to achieve path recovery is reduced by a factor of six using the improved path recovery scheme of the invention.

As will be appreciated from the foregoing description, the search path recovery mechanism for a sequential decoder in accordance with the present invention employs a self-concatenated convolutional code, that either is readily decodable by the sequential decoder for data recovery, or may be readily decoded (although sub-optimally) by a relatively simple Viterbi decoder. This is in stark contrast with a scheme of the type described in the Patent to Gilbert et al, which selects only one trellis code at a time from a predetermined set of trellis codes. As pointed out above, Gilbert et al base their code selection on the current signal and noise condition, there being an associated encoder and decoder set for each of the predetermined trellis codes.

The invention uses a self-concatenated convolutional code that may be generated in the transmitter in either of two exactly equivalent mechanisms. One is a conventional systematic feedback rate one-half convolutional encoder; the other is a replacement encoder, which encodes data in accordance with an alternative convolutional encoding mechanism of the type described in an article by H. A. Loeliger, entitled "New Turbo-like Codes," Proceedings of the IEEE International Symposium on Information Theory, Ulm, Germany, Jun. 29–Jul. 4, 1997, p. 109, hereinafter referred to as "Loeliger-codes." An advantage of the invention over conventional alternatives is that the overall code as seen by the sequential decoder is a conventional rate one-half code, and one-dimensional as a signal-space code which does not seem possible with ordinary concatenation. As noted above, simulations have shown that Viterbi decoding of the inner code significantly reduces the path recovery time.

While we have shown and described several embodiments in accordance with the present invention, it is to be understood that the same is not limited thereto but is susceptible to numerous changes and modifications as are known to a person skilled in the art, and we therefore do not wish to be limited to the details shown and described herein, but intend to cover all such changes and modifications as are obvious to one of ordinary skill in the art.

The invention claimed is:

1. A method of conducting data communications between a transmitter site and a receiver site, comprising the steps of:
   at said transmitter site,
   (a) encoding data to be transmitted using an encoding modulation mechanism to produce an encoded data stream, and
   (b) transmitting said encoded data stream over a communication channel to said receiver site; and
   at said receiver site,
   (c) receiving said encoded data stream from said communication channel,
   (d) subjecting said encoded data stream to a first decoding mechanism to recover said data, as long as said first decoding mechanism remains in synchronization,
   (e) in response to said first decoding mechanism failing to remain in synchronization, subjecting said encoded data stream to a second decoding mechanism to derive a quasi-recovered data stream, and
   (f) in response to said second decoding mechanism recovering synchronization using said quasi-recovered data stream, adjusting properties of said first decoding mechanism in accordance with said second decoding mechanism, and subjecting said encoded data stream to said first decoding mechanism as adjusted in accordance with said second decoding mechanism, to thereby recover said data, wherein
   step (a) comprises encoding data to be transmitted using a self-concatenated convolutional code that is either decodable by a sequential decoder as said first decoding mechanism in step (d), or is decodable by a Viterbi decoder in said second decoding mechanism, to derive said quasi-recovered data stream for path recovery in step (e), and wherein
   step (f) comprises coupling estimated outputs from said Viterbi decoder to a syndrome former, which estimates a recovered sequential decoding state and generates an estimate of the validity of the recovered state, summing a prescribed number of consecutive syndrome former outputs and, in response to the sum of said consecutive syndrome former outputs being zero, adjusting properties of said first decoding mechanism in accordance with the contents of said syndrome former.

2. The method according to claim 1, wherein said first decoding mechanism is operative to decode said encoded data stream based upon said encoded data stream being modulated with a encoding modulation mechanism that is effectively equivalent to a $2^M=2^{13}$ state convolutional encoder, having a $=027776_{octal}$ feedforward coefficients and $b=013773_{octal}$ feedback coefficients, and and said second decoding mechanism comprises a $2^K=8$ state Viterbi decoder, having $c=06_{octal}$ feedforward coefficients and $d=015_{octal}$ feedback coefficients, and time differentials and time differentials $\Delta u=11$, $\Delta y=10$.

3. The method according to claim 1, wherein said first decoding mechanism is operative to decode said encoded data stream based upon said encoded data stream being modulated with a encoding modulation mechanism that is effectively equivalent to a $2^M=2^{16}$ state convolutional encoder, having a feedforward coefficients and $b=0220015_{octal}$ feedback coefficients, and and said second decoding mechanism comprises a $2^K=8$ state Viterbi decoder, having $c=06_{octal}$ feedforward coefficients and $d=015_{octal}$ feedback coefficients, and time differentials and time differentials $\Delta y1=12$, $\Delta y2=13$.

4. A method of conducting data communications between a transmitter site and a receiver site, comprising the steps of:
   at said transmitter site,
   (a) encoding data to be transmitted using an encoding modulation mechanism to produce an encoded data stream, and
   (b) transmitting said encoded data stream over a communication channel to said receiver site; and
   at said receiver site,
   (c) receiving said encoded data stream from said communication channel,
   (d) subjecting said encoded data stream to a first decoding mechanism to recover said data, as long as said first decoding mechanism remains in synchronization,
   (e) in response to said first decoding mechanism failing to remain in synchronization, subjecting said encoded data stream to a second decoding mechanism to derive a quasi-recovered data stream, and
   (f) in response to said second decoding mechanism recovering synchronization using said quasi-recovered data stream, adjusting properties of said first decoding mechanism in accordance with said second decoding mechanism, and subjecting said encoded data stream to said first decoding mechanism as adjusted in accordance with said second decoding mechanism, to thereby recover said data, and wherein said encoding modulation mechanism is operative to perform $2^M$-state trellis-coded modulation, and said first decoding mechanism comprises a sequential decoding mechanism.

5. The method according to claim 4, wherein said second decoding mechanism comprises a $2^K$-state Viterbi decoding mechanism, where K<M.

6. The method according to claim 4, wherein said encoding modulation mechanism is effectively equivalent to a $2^M=2^{13}$ state convolutional encoder, having a $=027776_{octal}$ feedforward coefficients and $b=013773_{octal}$ feedback coefficients, and and said second decoding mechanism comprises a $2^K=8$ state Viterbi decoder, having $c=06_{octal}$ feedforward coefficients and $d=015_{octal}$ feedback coefficients, and time differentials $\Delta u=11$, $\Delta y=10$.

7. The method according to claim 4, wherein said encoding modulation mechanism is effectively equivalent to a $2^M=2^{16}$ state convolutional encoder, having a $=02_{octal}$ feedforward coefficients and $b=0220015_{octal}$ feedback coefficients, and and said second decoding mechanism comprises a $2^K=8$ state Viterbi decoder, having $c=06_{octal}$ feedforward coefficients and $d=015_{octal}$ feedback coefficients, and time differentials $\Delta y1=12$, $\Delta y2=13$.

8. A method of conducting data communications between a transmitter site and a receiver site, comprising the steps of:
   at said transmitter site,
   (a) encoding data to be transmitted using an encoding modulation mechanism to produce an encoded data stream, and
   (b) transmitting said encoded data stream over a communication channel to said receiver site; and
   at said receiver site,
   (c) receiving said encoded data stream from said communication channel,
   (d) subjecting said encoded data stream to a first decoding mechanism to recover said data, as long as said first decoding mechanism remains in synchronization,
   (e) in response to said first decoding mechanism failing to remain in synchronization, subjecting said encoded data stream to a second decoding mechanism to derive a quasi-recovered data stream, and (f) in response to said second decoding mechanism recovering synchronization using said quasi-recovered data stream, adjusting properties of said first decoding mechanism in accordance with said second decoding mechanism, and subjecting said encoded data stream to said first decoding mechanism as adjusted in accordance with said second decoding mechanism, to thereby recover said data, and wherein said first decoding mechanism is operative to decode said encoded data stream based upon said encoded data stream containing a self-concatenated convolutional code that is decodable by a sequential decoder, and wherein said second decoding mechanism is operative to decode said encoded data stream that is decodable by a Viterbi decoder to derive said quasi-recovered data stream for path recovery in step (e).

9. The method according to claim 8, wherein step (f) comprises coupling estimated outputs from said Viterbi decoder to a syndrome former, which estimates a recovered sequential decoding state and generates an estimate of the validity of the recovered state, summing a prescribed number of consecutive syndrome former outputs and, in response to the sum of said consecutive syndrome former outputs being zero, adjusting properties of said first decoding mechanism in accordance with the contents of said syndrome former.

10. The method according to claim 9, wherein said Viterbi decoder is coupled to a syndrome former, which is operative to estimate a recovered state of said sequential decoder and generate an estimate of the validity of said recovered state, and an adder which sums a number of consecutive syndrome former outputs and, in response to said being zero, sets path properties of said sequential decoder in accordance with contents of said syndrome former.

11. A method of conducting data communications between a transmitter site and a receiver site, comprising the steps of:
at said transmitter site,
(a) encoding data to be transmitted by a $2^M$-state convolutional code to produce an encoded data stream, and transmitting said encoded data stream over a communication channel to said receiver site; and
at said receiver site,
(b) receiving said encoded data stream from said communication channel and performing sequential decoding of said encoded data stream by means of a sequential decoding mechanism to derive a recovered data stream, as long as said sequential decoding mechanism remains in synchronization,
(c) in response to said sequential decoding mechanism failing to remain in synchronization, performing $2^K$-state Viterbi decoding of said encoded data stream, where K<M, to derive a quasi-recovered data stream,
(d) performing search path recovery of said sequential decoding of said encoded data stream, in accordance with said $2^K$-state Viterbi decoding of said encoded data stream in step (c), and
(e) in response to said search path recovery using said quasi-recovered data stream, decoding said encoded data stream by said sequential decoding mechanism, path search properties of which have been adjusted in step (d).

12. The method according to claim 11, wherein step (a) comprises encoding data to be transmitted using a self. concatenated convolutional code that is either sequentially decodable in step (b), or that is decodable by $2^K$-state Viterbi decoding in step (c).

13. The method according to claim 12, wherein said $2^M$-state convolutional code is equivalent to a $2^M=2^{13}$ state convolutional encoder, having a $=027776_{octal}$ feedforward coefficients and b=$013773_{octal}$ feedback coefficients, and said sequential decoding employs a sequential decoder and said $2^K$ state Viterbi decoding mechanism employs a $2^K=8$ state Viterbi decoder, having c=$06_{octal}$ feedforward coefficients and d=$015_{octal}$ feedback coefficients, and time differentials $\Delta u=11$, $\Delta y=10$.

14. The method according to claim 11, wherein said $2^M$-state convolutional code is equivalent to an $2^M=2^{16}$ state convolutional encoder, having a $=02_{octal}$ feedforward coefficients and b=$0220015_{octal}$ feedback coefficients, and said sequential decoding employs a sequential decoder and said $2^K$ state Viterbi decoding employs a $2^K=8$ state Viterbi decoder, having c=$06_{octal}$ feedforward coefficients and d=$015_{octal}$ feedback coefficients, and time differentials $\Delta y1=12$, $\Delta y2=13$.

15. The method according to claim 11, wherein step (e) comprises coupling Viterbi decoding estimated outputs to a syndrome former, which estimates a recovered sequential decoding state and generates an estimate of the validity of the recovered state, summing a prescribed number of consecutive syndrome former outputs and, in response to the sum of said consecutive syndrome former outputs being zero, adjusting properties of said sequential decoding in accordance with the contents of said syndrome former.

16. The method according to claim 12, wherein said first decoding mechanism is operative to decode said encoded data stream based upon said encoded data stream containing a self-concatenated convolutional code that is decodable by a sequential decoder, and wherein said second decoding mechanism is operative to decode said encoded data stream that is decodable by said $2^K$-state Viterbi decoder to derive said quasi-recovered data stream for path recovery.

17. A system for conducting data communications over a communications channel between a transmitter site and a receiver site, comprising:
at said transmitter site,
an encoder which is operative to encode data to produce an encoded data stream, and
a transmitter that is operative to transmit said encoded data stream over said communication channel to said receiver site; and
at said receiver site,
a receiver which is operative to receive said encoded data stream from said communication channel,
a first decoder which is operative to decode said encoded data and recover said data in accordance with a first decoding mechanism, as long as said first decoder remains in synchronization, and
a second decoder which is operative, in response to said first decoder failing to remain in synchronization, to decode said encoded data stream in accordance with a second decoding mechanism to derive a quasi-recovered data stream, and wherein
in response to said second decoder recovering synchronization using said quasi-recovered data stream, said first decoder is operative to decode said encoded data and recover said data in accordance with said first decoding mechanism, properties of which are adjusted in accordance with said second decoding mechanism employed by said second decoder, wherein
said encoder is operative to encode data to be transmitted using a self-concatenated convolutional code that is either decodable by a sequential decoder as said first decoder, or that is decodable by a Viterbi decoder as said second decoder to derive said quasi-recovered data stream, and wherein said Viterbi decoder is coupled to a syndrome former, which is operative to estimate a recovered state of said sequential decoder and generate an estimate of the validity of said recovered state, and an adder which sums a number of consecutive syndrome former outputs and, in response to said being zero, sets path properties of said sequential decoder in accordance with contents of said syndrome former.

18. The system according to claim 17, wherein said encoder employs an encoding modulation mechanism that is effectively equivalent to a $2^M=2^{13}$ state convolutional encoder, having a $=027776_{octal}$ feedforward coefficients and $b=013773_{octal}$ feedback coefficients, and and said second decoder comprises a $2^K=8$ state Viterbi decoder, having $c=06_{octal}$ feedforward coefficients and $d=015_{octal}$ feedback coefficients, and time differentials $\Delta u=11$, $\Delta y=10$.

19. A system according to claim 17, wherein said encoder employs an encoding modulation mechanism that is effectively equivalent to a $2^M=2^{16}$ state convolutional encoder, having a $=02_{octal}$ feedforward coefficients and $b=0220015_{octal}$ feedback coefficients, and and said second decoder mechanism comprises a $=2^K=8$ state Viterbi decoder, having $c=06_{octal}$ feedforward coefficients and $d=015_{octal}$ feedback coefficients, and time differentials $\Delta y1=12$, $\Delta y2=13$.

20. A system for conducting data communications over a communications channel between a transmitter site and a receiver site, comprising:

at said transmitter site, an encoder which is operative to encode data to produce an encoded data stream, and a transmitter that is operative to transmit said encoded data stream over said communication channel to said receiver site; and at said receiver site, a receiver which is operative to receive said encoded data stream from said communication channel, a first decoder which is operative to decode said encoded data and recover said data in accordance with a first decoding mechanism, as long as said first decoder remains in synchronization, and a second decoder which is operative, in response to said first decoder failing to remain in synchronization, to decode said encoded data stream in accordance with a second decoding mechanism to derive a quasi-recovered data stream, and wherein in response to said second decoder recovering synchronization using said quasi-recovered data stream, said first decoder is operative to decode said encoded data and recover said data in accordance with said first decoding mechanism, properties of which are adjusted in accordance with said second decoding mechanism employed by said second decoder, and wherein said encoder is operative to operative to perform $2^M$-state trellis-coded modulation, and said first decoder comprises a sequential decoder.

21. The system according to claim 20, wherein said second decoder comprises a $2^K$-state Viterbi decoder, where K<M.

22. A system for conducting data communications over a communications channel between a transmitter site and a receiver site, comprising:

at said transmitter site, an encoder which is operative to encode data to produce an encoded data stream, and a transmitter that is operative to transmit said encoded data stream over said communication channel to said receiver site; and at said receiver site, a receiver which is operative to receive said encoded data stream from said communication channel, a first decoder which is operative to decode said encoded data and recover said data in accordance with a first decoding mechanism, as long as said first decoder remains in synchronization, and a second decoder which is operative, in response to said first decoder failing to remain in synchronization, to decode said encoded data stream in accordance with a second decoding mechanism to derive a quasi-recovered data stream, and wherein in response to said second decoder recovering synchronization using said quasi-recovered data stream, said first decoder is operative to decode said encoded data and recover said data in accordance with said first decoding mechanism, properties of which are adjusted in accordance with said second decoding mechanism employed by said second decoder, and wherein said first decoder is operative to decode encoded data based upon said encoded data containing a self-concatenated convolutional code that is decodable by a sequential decoder, and wherein said second decoder is operative to decode said encoded data that is decodable by a Viterbi decoder to derive said quasi-recovered data stream.

* * * * *